United States Patent
Tanaka et al.

(10) Patent No.: US 10,135,395 B2
(45) Date of Patent: Nov. 20, 2018

(54) POWER AMPLIFIER CIRCUIT

(71) Applicant: Murata Manufacturing Co., Ltd., Kyoto (JP)

(72) Inventors: Satoshi Tanaka, Kyoto (JP); Masatoshi Hase, Kyoto (JP); Yuri Honda, Kyoto (JP); Kazuo Watanabe, Kyoto (JP); Takashi Soga, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/821,054

(22) Filed: Nov. 22, 2017

(65) Prior Publication Data

US 2018/0152143 A1    May 31, 2018

(30) Foreign Application Priority Data

Nov. 25, 2016  (JP) .................................. 2016-229142

(51) Int. Cl.
| | |
|---|---|
| *H03K 5/22* | (2006.01) |
| *H03F 1/02* | (2006.01) |
| *H03F 1/22* | (2006.01) |
| *H03F 1/56* | (2006.01) |
| *H03F 3/195* | (2006.01) |
| *H03F 3/213* | (2006.01) |

(52) U.S. Cl.
CPC ............. *H03F 1/0205* (2013.01); *H03F 1/22* (2013.01); *H03F 1/56* (2013.01); *H03F 3/195* (2013.01); *H03F 3/213* (2013.01); *H03F 2200/222* (2013.01); *H03F 2200/387* (2013.01); *H03F 2200/451* (2013.01)

(58) Field of Classification Search
None
See application file for complete search history.

(56) References Cited

U.S. PATENT DOCUMENTS 9,698,736 B2 *  7/2017  Ripley ...................... H03F 1/22
9,780,741 B2 * 10/2017  Ripley ...................... H03F 3/21
(Continued)

FOREIGN PATENT DOCUMENTS

| JP | 2015-115835 A | 6/2015 |
| WO | 2013/129431 A1 | 9/2013 |

OTHER PUBLICATIONS

Satoshi Tanaka, "Evolution of Power Amplifier for mobile applications", International Meeting for Future of Electron Devices, IEEE 2013.

*Primary Examiner* — Long Nguyen
(74) *Attorney, Agent, or Firm* — Pearne & Gordon LLP (57) ABSTRACT

A power amplifier circuit includes a first transistor, a second transistor, a first bias circuit supplying a first bias current or voltage, a second bias circuit supplying a second bias current or voltage, a first inductor, and a first capacitor. A power supply voltage is supplied to a collector of the first transistor, and an emitter thereof is grounded. A radio frequency signal and the first bias current or voltage are supplied to a base of the first transistor. The power supply voltage is supplied to a collector of the second transistor, and an emitter thereof is connected to the collector of the first transistor via the first capacitor and is grounded via the first inductor. The second bias current or voltage is supplied to a base of the second transistor. An amplified radio frequency signal is output from the collector of the second transistor.

20 Claims, 7 Drawing Sheets

(56) References Cited

U.S. PATENT DOCUMENTS

| | | |
|---|---|---|
| 2014/0347130 A1 | 11/2014 | Iijima et al. |
| 2015/0171796 A1 | 6/2015 | Matsui |
| 2016/0241195 A1 | 8/2016 | Lehtola |
| 2016/0241203 A1 | 8/2016 | Lehtola |
| 2016/0241295 A1 | 8/2016 | Lyalin |

* cited by examiner

POWER AMPLIFIER CIRCUIT

POWER AMPLIFIER CIRCUIT

This application claims priority from Japanese Patent Application No. 2016-229142 filed on Nov. 25, 2016. The content of this application is incorporated herein by reference in its entirety.

BACKGROUND

The present disclosure relates to a power amplifier circuit. In a mobile communication device, such as a cellular phone, a power amplifier circuit using a transistor is provided. "Evolution of Power Amplifier for mobile applications" by Satoshi Tanaka, International Meeting for Future of Electron Devices, Kansai (IMFEDK), IEEE, 2013, pp. 112-113 discloses a power amplifier circuit using a heterojunction bipolar transistor (HBT). Japanese Unexamined Patent Application Publication No. 2015-115835 discloses a power amplifier circuit including two cascode-connected HBTs.

BRIEF SUMMARY

In a power amplifier circuit, boosting of a power supply voltage can increase the maximum output power. However, in the power amplifier circuit disclosed in the above-described document "Evolution of Power Amplifier for mobile applications", the maximum power supply voltage is restricted due to the collector-base withstand voltage of the transistor. In the power amplifier circuit disclosed in the above-described publication, by cascode-connecting two transistors, the divided voltage is applied to each transistor, and thus, the maximum power supply voltage can be increased to be higher than that in the power amplifier circuit in the above-described document. However, to apply a power supply voltage higher than the maximum battery voltage, a booster conversion circuit is required, which increases the scale of the power amplifier circuit.

The present disclosure has been made in view of the above-described background. The present disclosure provides a power amplifier circuit in which the maximum output power can be increased without substantially increasing the scale of the power amplifier circuit.

According to an embodiment of the present disclosure, there is provided a power amplifier circuit including a first transistor, a second transistor, a first bias circuit that supplies a first bias current or a first bias voltage, a second bias circuit that supplies a second bias current or a second bias voltage, a first inductor, and a first capacitor. A power supply voltage is supplied to a collector of the first transistor. An emitter of the first transistor is grounded. A radio frequency signal and the first bias current or the first bias voltage are supplied to a base of the first transistor. The power supply voltage is supplied to a collector of the second transistor. An emitter of the second transistor is connected to the collector of the first transistor via the first capacitor, and is also grounded via the first inductor. The second bias current or the second bias voltage is supplied to a base of the second transistor. An amplified signal generated by amplifying the radio frequency signal is output from the collector of the second transistor.

According to an embodiment of the present disclosure, it is possible to provide a power amplifier circuit in which the maximum output power can be increased without substantially increasing the scale of the power amplifier circuit.

Other features, elements, and characteristics of the present disclosure will become more apparent from the following detailed description of embodiments of the present disclosure with reference to the attached drawings.

DETAILED DESCRIPTION

Embodiments of the present disclosure will be described below in detail with reference to the accompanying drawings. The same element is designated by like reference numeral, and an explanation thereof will be given only once and will not be repeated.

Figure 1:
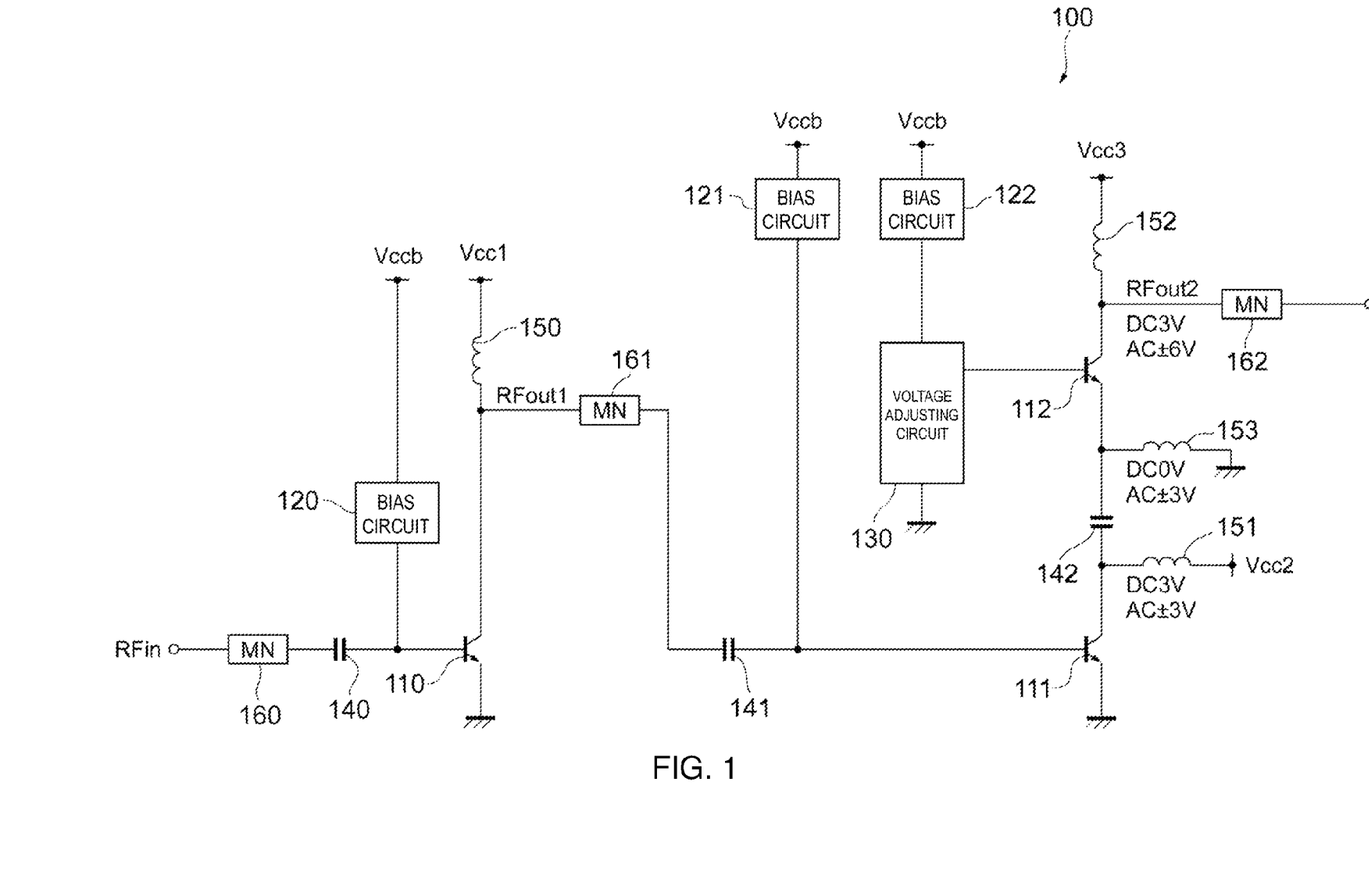
FIG. 1 illustrates an example of the configuration of a power amplifier circuit according to an embodiment of the disclosure.

FIG. 1 illustrates an example of the configuration of a power amplifier circuit (power amplifier circuit 100) according to an embodiment of the disclosure. In a mobile communication device, such as a cellular phone, the power amplifier circuit 100 amplifies an input radio frequency (RF) signal RFin and outputs an amplified signal RFout2. The frequency of the RF signal RFin is about several gigahertz, for example.

As shown in FIG. 1, the power amplifier circuit 100 includes transistors 110, 111, and 112, bias circuits 120, 121, and 122, a voltage adjusting circuit 130, capacitors 140, 141, and 142, inductors 150, 151, 152, and 153, and matching circuits 160, 161, and 162.

The power amplifier circuit 100 includes two-stage amplifiers. The first-stage amplifier (drive-stage amplifier) includes the transistor 110, while the second-stage amplifier (power-stage amplifier) includes the transistors 111 and 112. The transistors 110, 111, and 112 are bipolar transistors, such as HBTs. The drive-stage amplifier amplifies the RF signal RFin input via the matching circuit 160 and outputs an amplified signal RFout1. The amplified signal RFout1 is input into the power-stage amplifier via the matching circuit 161. The power-stage amplifier amplifies the amplified signal RFout1 and outputs the amplified signal RFout2. Hereinafter, the transistors 111 and 112 may also be collectively called an amplifier. In this embodiment, the power amplifier circuit 100 includes two stages of amplifiers. However, one stage of amplifier or three or more stages of amplifiers may be used.

A power supply voltage Vcc1 is supplied to the collector of the transistor 110 via the inductor 150. The base of the transistor 110 is connected to one end of the capacitor 140 and the emitter is grounded. The RF signal RFin and a bias current output from the bias circuit 120 are supplied to the base of the transistor 110. With this configuration, the amplified signal RFout1 is output from the collector of the transistor 110. The drive-stage amplifier does not include cascode-connected transistors. Such a configuration will also be called a single configuration.

A power supply voltage Vcc2 is supplied to the collector of the transistor 111 (first transistor) via the inductor 151. The base of the transistor 111 is connected to one end of the capacitor 141 and the emitter is grounded. The amplified signal RFout1 and a bias current (first bias current) output from the bias circuit 121 are supplied to the base of the transistor 111.

The transistor 112 (second transistor) is cascode-connected to the transistor 111 via the capacitor 142. This will be explained more specifically. A power supply voltage Vcc3 is supplied to the collector of the transistor 112 via the inductor 152. The base of the transistor 112 is connected to the voltage adjusting circuit 130 and the emitter is connected to one end of the capacitor 142. A bias current (second bias current) output from the bias circuit 122 is supplied to the base of the transistor 112 via the voltage adjusting circuit 130. One end of the inductor 153 is connected to the emitter of the transistor 112. In this manner, the power-stage amplifier includes the transistor 112 cascode-connected to the transistor 111. Such a configuration will also be called a cascode configuration. The size of the transistor 112 may be the same as the transistor 111 or may be smaller than the transistor 111. Details of the operation of the power-stage amplifier will be discussed later.

The bias circuits 120 and 121 (first bias circuit) and the bias circuit 122 (second bias circuit) each generate a bias current or a bias voltage and supply the bias current or the bias voltage to the bases of the transistors 110, 111, and 112, respectively.

Figure 2:
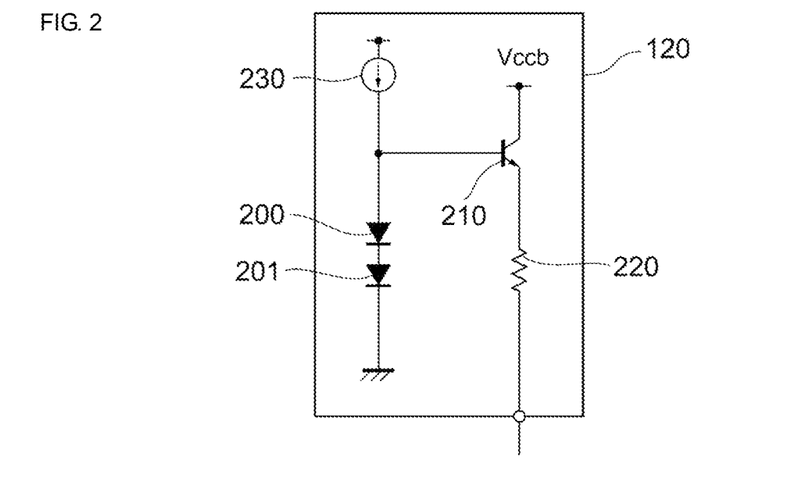
FIG. 2 illustrates an example of the configuration of a bias circuit.

FIG. 2 illustrates an example of the configuration of the bias circuit 120. The configuration of the bias circuits 121 and 122 is similar to that of the bias circuit 120, and a detailed explanation thereof will thus be omitted. As shown in FIG. 2, the bias circuit 120 includes diodes 200 and 201, a transistor 210, a resistor element 220, and a current source 230.

The diodes 200 and 201 and the current source 230 generate a predetermined level of voltage. This will be explained more specifically. The diodes 200 and 201 are connected in series with each other. A constant current is supplied from the current source 230 to the anode of the diode 200, and the cathode of the diode 201 is grounded. The anode of the diode 200 is connected to the base of the transistor 210. With this configuration, a predetermined level of voltage (about 2.6 V, for example) is generated in the base of the transistor 210. Instead of the diodes 200 and 201, bipolar transistors whose collector and base are connected to each other may be used.

A power supply voltage Vccb is supplied to the collector of the transistor 210. The base of the transistor 210 is connected to the anode of the diode 200, and the emitter is connected to one end of the resistor element 220. The transistor 210 supplies a bias current from the emitter to the base of the transistor 110 (see FIG. 1) via the resistor element 220.

Referring back to FIG. 1, the capacitors 140 and 141 remove direct current (DC) components of a RF signal. The inductors 150, 151, and 152 are choke inductors that suppress the coupling of a high-frequency signal to a power supply circuit.

The matching circuits 160, 161, and 162 are provided for performing impedance matching between corresponding circuits. The matching circuits 160, 161, and 162 are each constituted by an inductor and a capacitor, for example. The matching circuits 160, 161, and 162 may each be a low pass filter, a high pass filter, or a combination of a low pass filter and a high pass filter.

The operation of the power-stage amplifier will be described below in detail. For the sake of description, an explanation will be given, assuming that both of the power supply voltages Vcc2 and Vcc3 are a DC voltage of about 3 V (hereinafter indicated by DC3V). However, the power supply voltages Vcc2 and Vcc3 are not limited to about 3 V.

One end of the capacitor 142 (first capacitor) is connected to the emitter of the transistor 112, while the other end thereof is connected to the collector of the transistor 111. The capacitor 142 is provided so that the lower-stage transistor 111 and the upper-stage transistor 112 can be disconnected from each other for a DC and can be connected to each other for an alternating current (AC).

One end of the inductor 153 (first inductor) is connected to the emitter of the transistor 112, and the other end thereof is grounded. The inductor 153 exhibits high impedance for high-frequency signals and does not influence the amplification of RF signals. That is, the inductor 153 is provided so that the emitter of the transistor 112 can be grounded for a DC and can be connected to the collector of the transistor 111 for an AC.

An explanation will be given by focusing on the lower-stage transistor 111. The emitter of the transistor 111 is grounded, while the power supply voltage Vcc2 (DC3V) is supplied to the collector of the transistor 111. The AC voltage of the amplitude of a RF signal at the collector of the transistor 111 is about ±3 V (hereinafter indicated by AC±3V). Consequently, the collector voltage of the transistor 111 varies in a range of about 3 V±3 V (that is, about 0 to 6 V). The emitter of the upper-stage transistor 112 will now be focused. The emitter of the transistor 112 is grounded for a DC, and the emitter voltage thus becomes DC0V. The emitter of the transistor 112 is connected to the collector of the transistor 111 for an AC, and the emitter voltage thus becomes AC±3V. Consequently, the emitter voltage of the transistor 112 varies in a range of about 0 V±3 V (that is, about −3 to 3 V). The power supply voltage Vcc3 (DC3V) is supplied to the collector of the transistor 112 for a DC, and the collector voltage thus becomes DC3V. The AC voltage of the collector of the transistor 112 is AC±6V including the AC voltage (AC±3V) of the emitter of the transistor 112. Consequently, the collector voltage of the transistor 112 varies in a range of about 3 V±6 V (that is, about −3 to 9 V). That is, the signal amplitude (about 12 V) of the collector of the transistor 112 is about twice as high as that (about 6 V) of the collector of the transistor 111.

To turn ON the transistor 112, the base-emitter voltage of the transistor 112 is required to be equal to or higher than a threshold voltage (about 1.3 V, for example). Accordingly, the base voltage of the transistor 112 is required to vary in a range of about 1.3 V±3 V (that is, about −1.7 to 4.3 V) in accordance with the variation (AC±3V) in the emitter voltage of the transistor 112. From this point of view, in this embodiment, the voltage adjusting circuit 130 makes adjustments so that the base voltage of the transistor 112 will be variable for an AC. More specifically, the voltage adjusting circuit 130 is connected to the base of the transistor 112 and is operated so that the amplitude operation of the base voltage of the transistor 112 will not be restricted by the bias circuit 122.

The configuration of the power-stage amplifier of the power amplifier circuit 100 is a cascode configuration. Thus, the signal amplitude (about ±6 V, for example) of the collector of the upper-stage transistor 112 can be made about twice as high as the signal amplitude (about ±3 V, for example) of the collector of a transistor of an amplifier having a single configuration. That is, without the need to provide a booster conversion circuit for boosting the battery voltage to generate a power supply voltage, the signal amplitude can be increased.

Assuming that the output power of a signal is P, the collector voltage is V, and the load impedance of an amplifier is R, the relationships among these elements can be expressed by $P=V^2/R$. If the load impedance R is constant, when the collector voltage V is doubled, the output power P is quadrupled (four times). Unlike a power amplifier circuit including an amplifier having a single configuration, it is possible to increase the maximum output power due to an increase in the signal amplitude of the collector voltage without boosting the power supply voltage.

If the output power P is constant, when the collector voltage V is doubled, the load impedance R is quadrupled. Typically, when a load impedance of an amplifier is increased, the impedance conversion ratio, which is a conversion ratio for performing impedance matching with a subsequent device in an output matching circuit, is decreased. This reduces the insertion loss and the return loss in the output matching circuit, thereby improving the power-added efficiency. In this embodiment, too, the load impedance of the power-stage amplifier is increased due to an increase in the signal amplitude, thereby decreasing the impedance conversion ratio in the matching circuit 162. This reduces a loss of a RF signal in the matching circuit 162, thereby improving the power-added efficiency in the power amplifier circuit 100, compared with a power amplifier circuit including an amplifier having a single configuration. In this manner, by using an amplifier having a cascode configuration in a power amplifier circuit, it is possible to increase the maximum output power or to improve the power-added efficiency without substantially increasing the scale of the power amplifier circuit.

In this embodiment, the power-stage amplifier (final-stage amplifier) is formed in a cascode configuration. However, any stage of the amplifier in the power amplifier circuit may be formed in a cascode configuration. In a power amplifier circuit constituted by multiple stages of amplifiers, the output impedance of an output matching circuit is higher (about 50Ω, for example) than that of an interstage matching circuit. Accordingly, the impedance conversion ratio in the final-stage amplifier (power-stage amplifier) becomes higher than that in any other stages of the amplifiers. Forming the final stage of the amplifier in a cascode configuration can thus reduce the loss of a RF signal most effectively. Additionally, the scale of the power amplifier circuit is not increased significantly, compared with a case in which all amplifiers are formed in a cascode configuration.

The power supply voltages Vcc1, Vcc2, and Vcc3 respectively supplied to the transistors 110, 111, and 112 via the inductors 150, 151, and 152 may be a voltage generated by stepping down the battery voltage by a buck converter (step-down DC-to-DC converter). The power supply voltages Vcc1, Vcc2, and Vcc3 may alternatively be a voltage generated by stepping up the battery voltage by a buck-boost converter (step-up DC-to-DC converter) if the boosted voltage is within the withstand voltage of the transistors 110, 111, and 112. The power supply voltage Vccb supplied to the bias circuits 120, 121, and 122 may be the battery voltage, for example.

Figure 3:
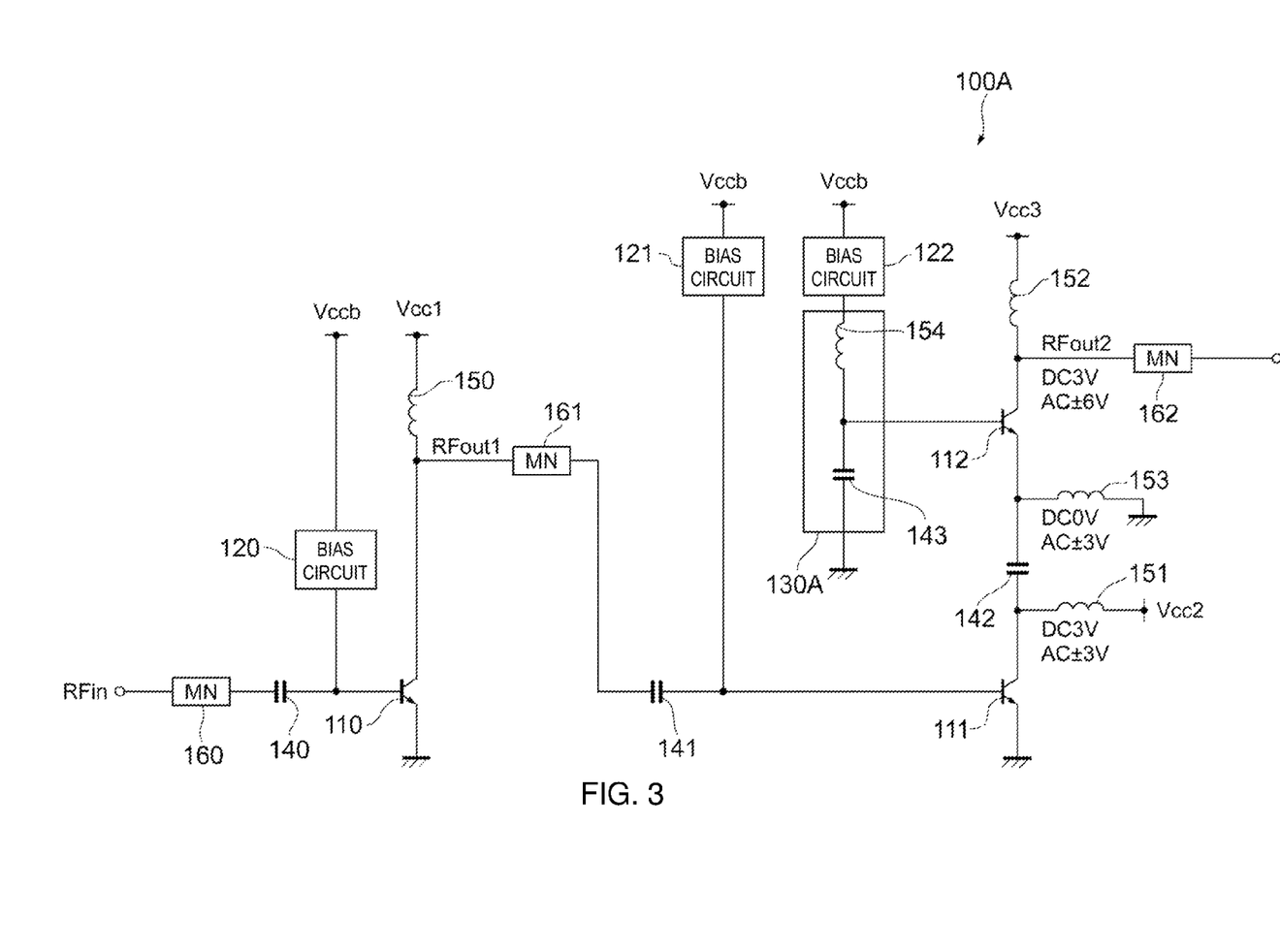
FIG. 3 illustrates another example of the configuration of a power amplifier circuit according to an embodiment of the disclosure.

FIG. 3 illustrates another example of the configuration of a power amplifier circuit (power amplifier circuit 100A) according to an embodiment of the disclosure. The same elements as those of the power amplifier circuit 100 are designated by like reference numerals, and an explanation thereof will be omitted. In the following description, the same points as those of the embodiment shown in FIG. 1 will not be explained, and only different points will be explained. Features similar to those obtained in the embodiment shown in FIG. 1 will not be repeated.

In FIG. 3, a specific example of the voltage adjusting circuit 130 in the power amplifier circuit 100 is shown as a voltage adjusting circuit 130A.

The voltage adjusting circuit 130A includes a capacitor 143 and an inductor 154. One end of the capacitor 143 (second capacitor) is connected to the base of the transistor 112, and the other end thereof is grounded. A bias current or a bias voltage output from the bias circuit 122 is supplied to one end of the inductor 154 (second inductor), and the other end of the inductor 154 is connected to the base of the transistor 112. This configuration makes it possible to stabilize the amplitude operation of the base voltage of the transistor 112.

With this configuration, features similar to those obtained by the power amplifier circuit 100 are also obtained. The configuration of the voltage adjusting circuit 130 is not restricted to that of the voltage adjusting circuit 130A. The voltage adjusting circuit 130 may also include an inductor connected in series with the capacitor 143, for example.

Figure 4:
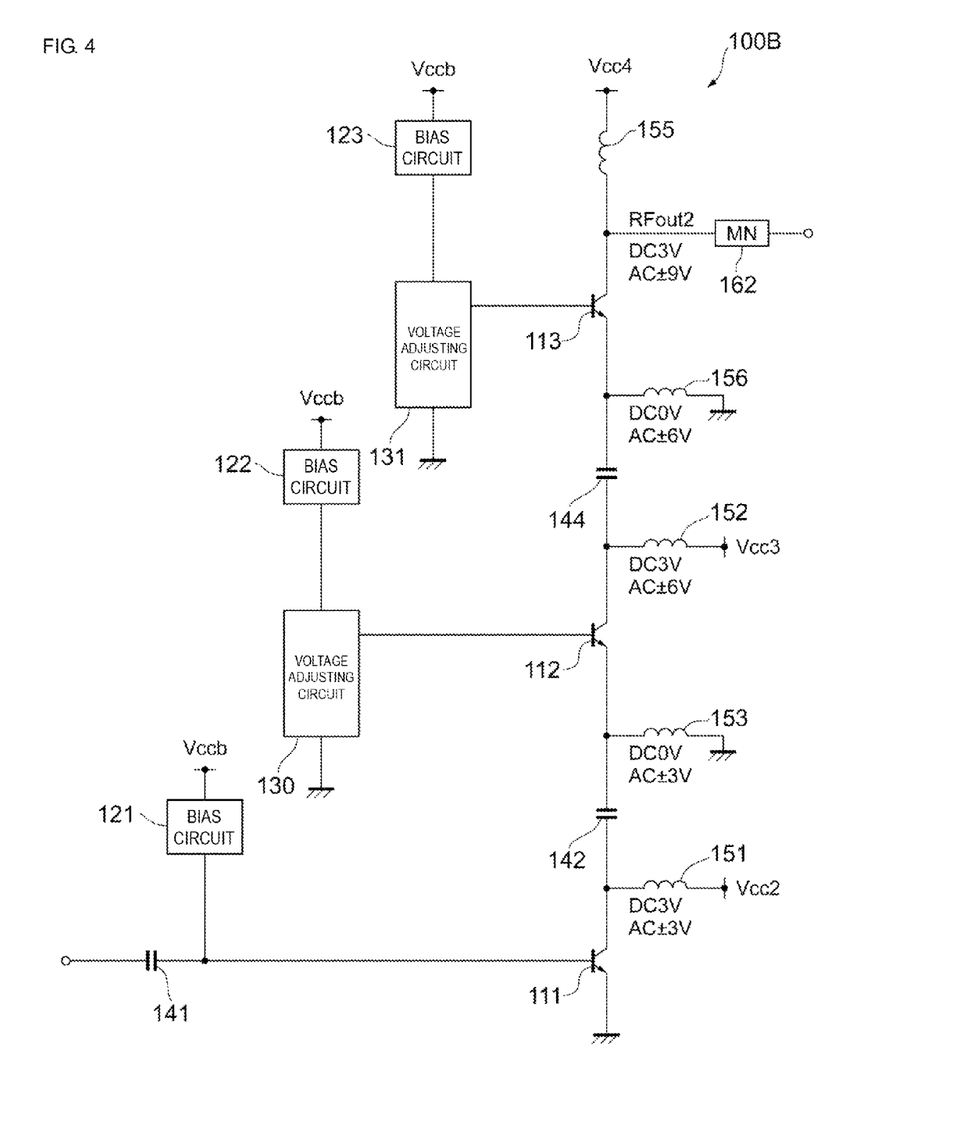
FIG. 4 illustrates another example of the configuration of a power amplifier circuit according to an embodiment of the disclosure.

FIG. 4 illustrates another example of the configuration of a power amplifier circuit (power amplifier circuit 100B) according to an embodiment of the disclosure. The same elements as those of the power amplifier circuit 100 are designated by like reference numerals, and an explanation thereof will be omitted. For the sake of description, elements only related to the power-stage amplifier of the power amplifier circuit 100B are shown in FIG. 4. In the power amplifier circuit 100B, three transistors are cascode-connected to each other in the power-stage amplifier.

In a manner similar to the transistor 112 cascode-connected to the transistor 111 shown in FIG. 1, a transistor 113 (third transistor) is cascode-connected to the transistor 112 via a capacitor 144 (third capacitor). This will be explained more specifically. A power supply voltage Vcc4 is supplied to the collector of the transistor 113 via an inductor 155. The base of the transistor 113 is connected to a voltage adjusting circuit 131, and the emitter is connected to one end of the capacitor 144. A bias current (third bias current) output from a bias circuit 123 (third bias circuit) is supplied to the base of the transistor 113 via the voltage adjusting circuit 131. The emitter of the transistor 113 is grounded for a DC via an inductor 156 (third inductor). The configurations of the bias circuit 123, the voltage adjusting circuit 131, the capacitor 144, and the inductors 155 and 156 are respectively similar to those of the bias circuit 122, the voltage adjusting circuit 130, the capacitor 142, and the inductors 152 and 153, and a detailed explanation thereof will thus be omitted.

The topmost-stage transistor 113 is disconnected from the intermediate-stage transistor 112 for a DC and is connected thereto for an AC. The emitter of the transistor 113 is grounded for a DC, and the emitter voltage thus becomes DC0V. The emitter of the transistor 113 is connected to the collector of the transistor 112 for an AC, and the emitter voltage thus becomes AC±6V. Consequently, the emitter voltage of the transistor 113 varies in a range of about 0 V±6 V (that is, about −6 to 6 V). The power supply voltage Vcc4 (DC3V) is supplied to the collector of the transistor 113 for a DC, and the collector voltage thus becomes DC3V. The AC voltage of the collector of the transistor 113 is AC±9V including the AC voltage (AC±6V) of the emitter of the transistor 113. Consequently, the collector voltage of the transistor 113 varies in a range of about 3 V±9 V (that is, about −6 to 12 V). That is, the signal amplitude (about 18 V) of the collector of the transistor 113 is about three times as high as that (about 6 V) of the collector of the transistor 111.

As described above, three or more transistors may be cascode-connected to each other. The signal amplitude of the collector of the topmost-stage transistor (transistor 113 in the example in FIG. 4) is increased to a higher level than that in the power amplifier circuit 100. Consequently, the maximum output power in the power amplifier circuit 100B is increased to a higher level than that in the power amplifier circuit 100. Alternatively, the load impedance of the amplifier in the power amplifier circuit 100B is increased to a higher level than that in the power amplifier circuit 100. The impedance conversion ratio is thus decreased, thereby further reducing a loss of a RF signal in the matching circuit 162. When N transistors are cascode-connected to each other, the signal amplitude of the collector of the topmost-stage transistor is about N times as high as that of an amplifier having a single configuration. If the load impedance is increased to a sufficient level in accordance with an increased number of cascode-connected transistors, the output matching circuit (matching circuit 162 in the example in FIG. 4) may not be necessary.

Figure 5:
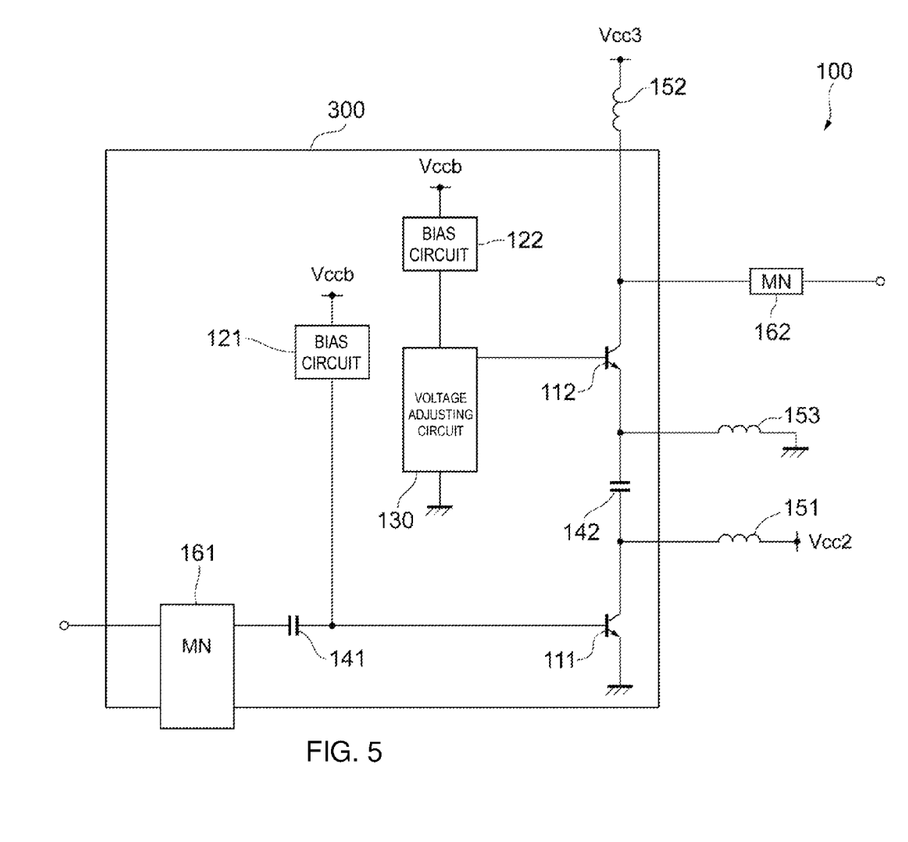
FIG. 5 schematically illustrates an example of a power amplifier circuit mounted on an integrated circuit according to an embodiment of the disclosure.

FIG. 5 schematically illustrates an example of a power amplifier circuit mounted on an integrated circuit according to an embodiment of the disclosure. In the power amplifier circuit 100, the capacitor 142 for connecting the collector of the transistor 111 and the emitter of the transistor 112 is mounted on a HBT chip (integrated circuit) 300 on which the transistors 111 and 112 are mounted. This configuration can avoid the influence of a parasitic inductor, which would occur when the capacitor 142 is mounted outside the HBT chip 300. The configuration of the power amplifier circuit 100 can also be simplified, compared with a power amplifier circuit in which the capacitor 142 is mounted outside the HBT chip 300.

The inductors 151, 152, and 153 are mounted on a substrate different from the HBT chip 300. If the matching circuit 161 is constituted by a capacitor and an inductor, the capacitor may be mounted on the HBT chip 300, and the inductor may be mounted outside the HBT chip 300.

Figure 6A:
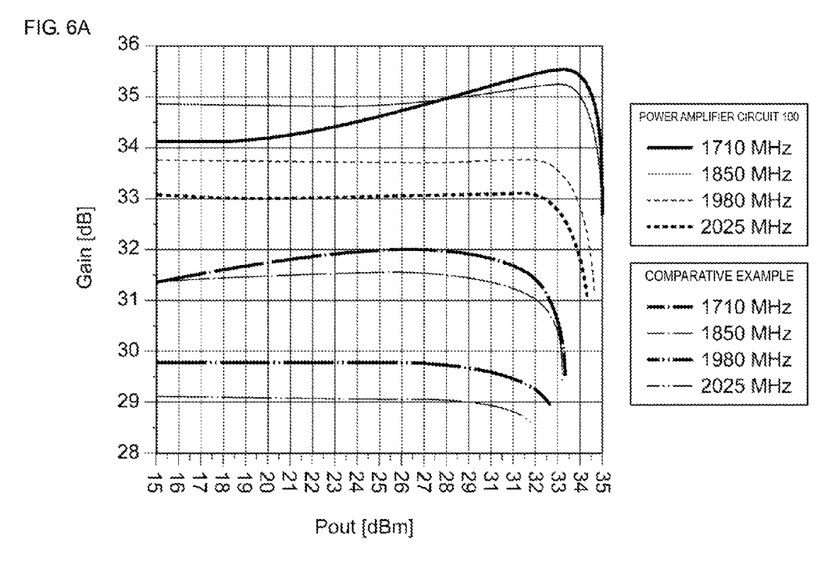
FIG. 6A is a graph illustrating the simulation results of the gain in the power amplifier circuit shown in FIG. 1 and a comparative example.

FIG. 6A is a graph illustrating the simulation results of the gain in the power amplifier circuit 100 and a comparative example. In this graph, the vertical axis indicates gain (dB), and the horizontal axis indicates output power (dBm). FIG. 6A illustrates the simulation results of the gain in the power amplifier circuit 100 and the comparative example when the frequency is changed to about 1710 MHz, 1850 MHz, 1980 MHz, and 2025 MHz while the load impedance is being constant. The comparative example is a power amplifier circuit including a power-stage amplifier having a single configuration instead of the cascode configuration of the power amplifier circuit 100.

FIG. 6A shows that the maximum output power is increased to a higher level in the power amplifier circuit 100 than in the comparative example regardless of the frequency value. More specifically, the maximum output power that achieves a predetermined level of the gain in the power amplifier circuit 100 is increased to a higher level than that in the comparative example by about 2 dB.

Figure 6B:
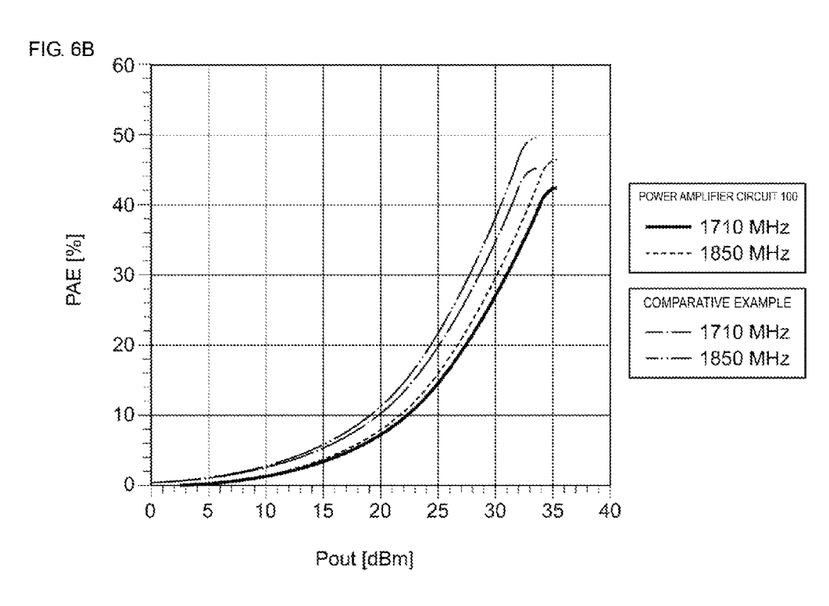
FIG. 6B is a graph illustrating the simulation results of the power-added efficiency in the power amplifier circuit shown in FIG. 1 and a comparative example.

FIG. 6B is a graph illustrating the simulation results of the power-added efficiency in the power amplifier circuit 100 and a comparative example. In this graph, the vertical axis indicates the power-added efficiency (PAE) (%), and the horizontal axis indicates output power (dBm). FIG. 6B illustrates the simulation results of the power-added efficiency in the power amplifier circuit 100 and the comparative example when the frequency is changed to about 1710 MHz and 1850 MHz while the load impedance is being constant.

FIG. 6B shows that the output power which maximizes the power-added efficiency is increased to a higher level than that in the comparative example by about 2 dB regardless of the frequency value. That is, the maximum output power in the power amplifier circuit 100 is increased to a higher level than that in the comparative example. The reason why these simulation results are obtained is that, even with the same load impedance as that of the comparative example, the signal amplitude of the collector of the upper-stage transistor can be increased in the power amplifier circuit 100. That is, these simulation results have validated the effectiveness of the disclosure.

Embodiments of the disclosure have been discussed above. The power amplifier circuits 100, 100A, and 100B each include the transistors 111 and 112. The collector of the transistor 111 and the emitter of the transistor 112 are connected to each other via the capacitor 142. This configuration can increase the signal amplitude of the collector of the upper-stage transistor 112 to be about twice as high as that of a transistor of an amplifier having a single configuration. Consequently, the output power or the load impedance of the amplifier can be increased without necessarily boosting the power supply voltage. In the power amplifier circuits 100, 100A, and 100B, it is thus possible to increase the maximum output power or to improve the power-added efficiency without necessarily substantially increasing the scale of the power amplifier circuit.

The power amplifier circuits 100, 100A, and 100B each include the voltage adjusting circuit 130 (130A) that adjusts the base voltage of the transistor 112. This can stabilize the amplitude operation of the base voltage of the transistor 112, thereby making it possible to maintain the transistor 112 in the ON state.

The configuration of the voltage adjusting circuit 130 is not restricted to a particular configuration. For example, the voltage adjusting circuit 130 may include the capacitor 143 that causes the base of the transistor 112 to be grounded for an AC. The voltage adjusting circuit 130 may include the inductor 154 between the bias circuit 122 and the base of the transistor 112.

The power amplifier circuit 100B also includes the transistor 113, and the collector of the transistor 112 and the emitter of the transistor 113 are connected to each other via the capacitor 144. This configuration further increases the signal amplitude of the collector of the topmost-stage transistor 113 to a higher level than that of the transistor 112 in the power amplifier circuit 100, thereby making it possible to increase the output power or the load impedance of the amplifier. It is thus possible to further increase the maximum output power or to further improve the power-added efficiency to a higher level in the power amplifier circuit 100B than in the power amplifier circuit 100.

In the power amplifier circuits 100, 100A, and 100B, the capacitor 142 is mounted on the HBT chip 300 on which the transistors 111 and 112 are mounted. This can avoid the influence of a parasitic inductor. The configuration of the power amplifier circuits 100, 100A, and 100B can also be simplified, compared with a case in which the capacitor 142 is mounted outside the HBT chip 300.

In the power amplifier circuits 100, 100A, and 100B, the configuration of the inductors 151, 152, and 153 is not limited to a particular configuration. For example, the inductors 151, 152, and 153 may be mounted outside the HBT chip 300.

The above-described embodiments are provided for facilitating the understanding of the invention, but are not intended to be exhaustive or to limit the invention to the precise forms disclosed. Modifications and/or improvements may be made without departing from the scope and spirit of the invention, and equivalents of the invention are also encompassed in the invention. That is, suitable design changes made to the embodiments by those skilled in the art are also encompassed in the invention within the scope and spirit of the invention. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the invention within the scope and spirit of the invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier circuit comprising:
   a first transistor;
   a second transistor;
   a first bias circuit that supplies a first bias current or a first bias voltage;
   a second bias circuit that supplies a second bias current or a second bias voltage;
   a first inductor; and
   a first capacitor, wherein
   a power supply voltage is supplied to a collector of the first transistor,
   an emitter of the first transistor is grounded,
   a radio frequency signal and the first bias current or the first bias voltage are supplied to a base of the first transistor,
   the power supply voltage is supplied to a collector of the second transistor,
   an emitter of the second transistor is connected to the collector of the first transistor via the first capacitor, and is grounded via the first inductor,
   the second bias current or the second bias voltage is supplied to a base of the second transistor, and
   an amplified signal generated by amplifying the radio frequency signal is output from the collector of the second transistor.

2. The power amplifier circuit according to claim 1, further comprising:
   a voltage adjusting circuit that adjusts a base voltage of the second transistor.

3. The power amplifier circuit according to claim 2, wherein the voltage adjusting circuit includes a second capacitor that is connected at one end to the base of the second transistor and is grounded at the other end.

4. The power amplifier circuit according to claim 2, wherein the voltage adjusting circuit includes a second inductor between the second bias circuit and the base of the second transistor.

5. The power amplifier circuit according to claim 3, wherein the voltage adjusting circuit includes a second inductor between the second bias circuit and the base of the second transistor.

6. The power amplifier circuit according to claim 1, further comprising:
   a third transistor;
   a third bias circuit that supplies a third bias current or a third bias voltage;
   a third inductor; and
   a third capacitor, wherein
   the power supply voltage is supplied to a collector of the third transistor,
   an emitter of the third transistor is connected to the collector of the second transistor via the third capacitor, and is grounded via the third inductor,
   the third bias current or the third bias voltage is supplied to a base of the third transistor, and
   an amplified signal generated by amplifying the radio frequency signal is output from the collector of the third transistor.

7. The power amplifier circuit according to claim 2, further comprising:
   a third transistor;
   a third bias circuit that supplies a third bias current or a third bias voltage;
   a third inductor; and
   a third capacitor, wherein
   the power supply voltage is supplied to a collector of the third transistor,
   an emitter of the third transistor is connected to the collector of the second transistor via the third capacitor, and is grounded via the third inductor,
   the third bias current or the third bias voltage is supplied to a base of the third transistor, and
   an amplified signal generated by amplifying the radio frequency signal is output from the collector of the third transistor.

8. The power amplifier circuit according to claim 3, further comprising:
   a third transistor;
   a third bias circuit that supplies a third bias current or a third bias voltage;
   a third inductor; and
   a third capacitor, wherein
   the power supply voltage is supplied to a collector of the third transistor,
   an emitter of the third transistor is connected to the collector of the second transistor via the third capacitor, and is grounded via the third inductor,
   the third bias current or the third bias voltage is supplied to a base of the third transistor, and
   an amplified signal generated by amplifying the radio frequency signal is output from the collector of the third transistor.

9. The power amplifier circuit according to claim 4, further comprising:
   a third transistor;
   a third bias circuit that supplies a third bias current or a third bias voltage;
   a third inductor; and
   a third capacitor, wherein the power supply voltage is supplied to a collector of the third transistor, an emitter of the third transistor is connected to the collector of the second transistor via the third capacitor, and is grounded via the third inductor, the third bias current or the third bias voltage is supplied to a base of the third transistor, and an amplified signal generated by amplifying the radio frequency signal is output from the collector of the third transistor.

10. The power amplifier circuit according to claim 1, wherein the first capacitor is mounted on an integrated circuit on which the first and second transistors are mounted.

11. The power amplifier circuit according to claim 2, wherein the first capacitor is mounted on an integrated circuit on which the first and second transistors are mounted.

12. The power amplifier circuit according to claim 3, wherein the first capacitor is mounted on an integrated circuit on which the first and second transistors are mounted.

13. The power amplifier circuit according to claim 4, wherein the first capacitor is mounted on an integrated circuit on which the first and second transistors are mounted.

14. The power amplifier circuit according to claim 6, wherein the first capacitor is mounted on an integrated circuit on which the first and second transistors are mounted.

15. The power amplifier circuit according to claim 1, wherein the first inductor is mounted on a substrate different from an integrated circuit on which the first and second transistors are mounted.

16. The power amplifier circuit according to claim 2, wherein the first inductor is mounted on a substrate different from an integrated circuit on which the first and second transistors are mounted.

17. The power amplifier circuit according to claim 3, wherein the first inductor is mounted on a substrate different from an integrated circuit on which the first and second transistors are mounted.

18. The power amplifier circuit according to claim 4, wherein the first inductor is mounted on a substrate different from an integrated circuit on which the first and second transistors are mounted.

19. The power amplifier circuit according to claim 6, wherein the first inductor is mounted on a substrate different from an integrated circuit on which the first and second transistors are mounted.

20. The power amplifier circuit according to claim 10, wherein the first inductor is mounted on a substrate different from an integrated circuit on which the first and second transistors are mounted.

\* \* \* \* \*